(12) United States Patent
Kawahara et al.

(10) Patent No.: US 9,869,032 B2
(45) Date of Patent: Jan. 16, 2018

(54) MANUFACTURING METHOD OF PHTHALOCYANINE CRYSTAL BY MILLING CRYSTAL TRANSFORMATION FOR AT LEAST 1,000 HOURS

(71) Applicant: CANON KABUSHIKI KAISHA, Tokyo (JP)

(72) Inventors: Masataka Kawahara, Mishima (JP); Masato Tanaka, Tagata-gun (JP); Jumpei Kuno, Mishima (JP); Tsutomu Nishida, Mishima (JP); Kaname Watariguchi, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 15/361,636

(22) Filed: Nov. 28, 2016

(65) Prior Publication Data

US 2017/0073835 A1    Mar. 16, 2017

Related U.S. Application Data

(62) Division of application No. 14/721,307, filed on May 26, 2015, now abandoned.

(30) Foreign Application Priority Data

Jun. 3, 2014    (JP) .................................. 2014-114918

(51) Int. Cl.
*C30B 1/12* (2006.01)
*G03G 5/06* (2006.01)
(Continued)

(52) U.S. Cl.
CPC .............. *C30B 1/12* (2013.01); *C09B 47/045* (2013.01); *C30B 7/14* (2013.01); *C30B 29/54* (2013.01); *G03G 5/0696* (2013.01)

(58) Field of Classification Search
CPC ................ C30B 7/14; C30B 7/00; C30B 1/12
See application file for complete search history.

(56) References Cited

U.S. PATENT DOCUMENTS 5,106,533 A *  4/1992  Hendrickson ....... B01F 3/04439
                                                        106/31.65
5,459,004 A    10/1995  Daimon et al.
                        (Continued)

FOREIGN PATENT DOCUMENTS

JP    H05-279591    10/1993
JP    H07-331107    12/1995
                    (Continued)

OTHER PUBLICATIONS

Diamond, et al. Handbook of Imaging Materials, New York: Marcel-Dekker, Inc. (2002) 145-64.

*Primary Examiner* — Christopher D Rodee
(74) *Attorney, Agent, or Firm* — Fitzpatrick, Cella, Harper Scinto

(57) ABSTRACT

The present invention provides: an electrophotographic photosensitive member which reduces image defects due to ghosting not only under a normal temperature and normal humidity environment but also even under a low temperature and low humidity environment; and a novel phthalocyanine crystal. The electrophotographic photosensitive member of the present invention comprises a photosensitive layer which comprises a phthalocyanine crystal in which a N,N-dimethylformamide is contained. The content of the N,N-dimethylformamide is 0.1% by mass or more and 1.5% by mass or less based on the phthalocyanine crystal.

2 Claims, 2 Drawing Sheets

(51) Int. Cl.
*C09B 47/04* (2006.01)
*C30B 7/14* (2006.01)
*C30B 29/54* (2006.01)

(56) References Cited

U.S. PATENT DOCUMENTS

| | | | |
|---|---|---|---|
| 5,834,149 | A | 11/1998 | Tambo et al. |
| 6,245,472 | B1 | 6/2001 | Tanaka |
| 6,284,420 | B1* | 9/2001 | Liu .................... C09B 67/0016 430/59.5 |
| 6,391,505 | B1 | 5/2002 | Hamasaki et al. |
| 6,472,524 | B2 | 10/2002 | Tanaka |
| 6,492,080 | B1* | 12/2002 | Burt .................... G03G 5/0696 430/133 |
| 8,518,615 | B2 | 8/2013 | Tanaka |
| 8,974,991 | B2 | 3/2015 | Kawahara et al. |
| 9,068,083 | B2 | 6/2015 | Tanaka et al. |
| 9,436,106 | B2 | 9/2016 | Kuno et al. |
| 9,459,545 | B2 | 10/2016 | Tanaka et al. |
| 9,500,965 | B2 | 11/2016 | Tanaka |
| 9,563,139 | B2* | 2/2017 | Kawahara ............ G03G 5/0696 |
| 9,645,515 | B2* | 5/2017 | Kuno .................. G03G 5/0662 |
| 2003/0116017 | A1* | 6/2003 | Pozarnsky ............ B01D 47/00 95/149 |
| 2005/0100806 | A1* | 5/2005 | Hongo ................ C09B 67/0022 430/78 |
| 2006/0234146 | A1 | 10/2006 | Miki et al. |
| 2008/0220356 | A1* | 9/2008 | Yamada ................ G03G 5/051 430/69 |
| 2008/0268356 | A1* | 10/2008 | Wu ...................... G03G 5/0517 430/57.2 |
| 2009/0185821 | A1* | 7/2009 | Iwamoto ............. G03G 5/0535 430/58.65 |
| 2009/0297967 | A1 | 12/2009 | Wu |
| 2009/0325090 | A1 | 12/2009 | Wu et al. |
| 2014/0170542 | A1 | 6/2014 | Tanaka |
| 2014/0170543 | A1 | 6/2014 | Tanaka |
| 2014/0205946 | A1 | 7/2014 | Sugiyama et al. |
| 2014/0308606 | A1 | 10/2014 | Tanaka et al. |
| 2015/0316863 | A1 | 11/2015 | Tanaka et al. |
| 2015/0316864 | A1 | 11/2015 | Kuno et al. |
| 2015/0346617 | A1 | 12/2015 | Kawahara et al. |
| 2015/0362847 | A1 | 12/2015 | Tanaka et al. |
| 2015/0362850 | A1 | 12/2015 | Tanaka et al. |
| 2016/0131985 | A1* | 5/2016 | Tanaka ................ G03G 5/0436 430/56 |
| 2016/0154326 | A1* | 6/2016 | Kumoi .................. G03G 5/043 399/111 |
| 2016/0154328 | A1* | 6/2016 | Kumoi .................... G03G 5/06 399/111 |
| 2016/0252833 | A1* | 9/2016 | Kumoi ................ G03G 5/0696 |

FOREIGN PATENT DOCUMENTS

| | | |
|---|---|---|
| JP | 2001-040237 | 2/2001 |
| JP | 2011-094101 | 5/2011 |

* cited by examiner

MANUFACTURING METHOD OF PHTHALOCYANINE CRYSTAL BY MILLING CRYSTAL TRANSFORMATION FOR AT LEAST 1,000 HOURS

This application is a division of application Ser. No. 14/721,307 filed May 26, 2015, which in turn claims benefit of Japanese Patent Application No. 2014-114918 filed Jun. 3, 2014.

BACKGROUND OF THE INVENTION

Field of the Invention

The present invention relates to an electrophotographic photosensitive member, a manufacturing method of an electrophotographic photosensitive member, a process cartridge and an electrophotographic apparatus, and a phthalocyanine crystal and a manufacturing method of a phthalocyanine crystal.

Description of the Related Art

Since the oscillation wavelength of a semiconductor laser commonly used as an image exposing unit in the field of electrophotography is in the long wavelength range of 650 to 820 nm, electrophotographic photosensitive members having high sensitivity to the light in the long wavelength range are currently under development.

Phthalocyanine pigments are effective as charge generating substances having high sensitivity to the light ranging to such a long wavelength region. Oxytitanium phthalocyanine and gallium phthalocyanine in particular have excellent sensitivity properties, and various crystal forms have been reported until now.

Although an electrophotographic photosensitive member using a phthalocyanine pigment has excellent sensitivity properties, a problem is that the generated photo carriers tend to remain in a photosensitive layer so as to act as a memory, easily causing potential variation such as ghosting.

Japanese Patent Application Laid-Open No. 2001-40237 discloses that the addition of a specific organic electron acceptor to a phthalocyanine pigment during acid pasting has a sensitizing effect. This method has, however, problems that an additive (organic electron acceptor) may be subject to a chemical change and that the conversion to a desired crystalline form may be difficult in some cases.

Japanese Patent Application Laid-Open No. H07-331107 discloses a hydroxygallium phthalocyanine crystal which contains a polar organic solvent. According to the description, with use of a transformation solvent such as N,N-dimethylformamide, the molecule of the transformation solvent is incorporated in the crystal, so that a crystal having excellent sensitivity properties is produced.

Various attempts have been made to improve electrophotographic photosensitive members as described above.

For further improvement in high-quality picture in recent years, it is desired to prevent image degradation due to ghosting in various environments. Japanese Patent Application Laid-Open No. H07-331107 discloses a phthalocyanine crystal which contains 2.1% by weight N,N-dimethylformamide. As a result of examination by the present inventors, it was found that the generated photo carriers are liable to remain in a photosensitive layer depending on the content of N,N-dimethylformamide, easily causing potential variation such as ghosting in some cases. It was thus found that there is a room for further improving ghosting.

SUMMARY OF THE INVENTION

One embodiment of the present invention is directed to providing an electrophotographic photosensitive member which reduces image defects due to ghosting not only under a normal temperature and normal humidity environment but also even under a low temperature and low humidity environment as especially severe conditions, and a manufacturing method thereof; and a process cartridge and an electrophotographic apparatus.

Further, another embodiment of the present invention is directed to providing a phthalocyanine crystal which contains a specific amount of N,N-dimethylformamide in the crystal, and a manufacturing method thereof.

According to one aspect of the present invention, there is provided an electrophotographic photosensitive member comprising a support and a photosensitive layer on the support, wherein the photosensitive layer comprises a phthalocyanine crystal in which a N,N-dimethylformamide is contained, and wherein the content of the N,N-dimethylformamide is 0.1% by mass or more and 1.5% by mass or less based on a phthalocyanine in the phthalocyanine crystal.

According to another aspect of the present invention, there is provided a process cartridge which integrally supports the electrophotographic photosensitive member and at least one unit selected from the group consisting of a charging unit, a developing unit, and a cleaning unit, the cartridge being detachably mountable to a main body of an electrophotographic apparatus.

According to further aspect of the present invention, there is provided an electrophotographic apparatus having the electrophotographic photosensitive member, with a charging unit, an exposing unit, a developing unit and a transferring unit.

According to further aspect of the present invention, there is provided a phthalocyanine crystal in which a N,N-dimethylformamide is contained, wherein the content of the N,N-dimethylformamide is 0.1% by mass or more and 1.5% by mass or less based on a phthalocyanine in the phthalocyanine crystal.

According to further aspect of the present invention, there is provided a phtalocyanine crystal which is obtained by performing a crystal transformation by milling a mixture of the phtalocyanine and the N,N-dimethylformamide, wherein a time period for the milling is 250 hours or more.

According to further aspect of the present invention, there is provided a phthalocyanine which is obtained by an acid pasting method prior to the step of performing the crystal transformation.

According to the present invention, an electrophotographic photosensitive member which reduces image defects due to ghosting not only under a normal temperature and normal humidity environment but also even under a low temperature and low humidity environment as especially severe conditions, and a manufacturing method thereof; and a process cartridge and an electrophotographic apparatus can be obtained.

Further, according to the present invention, a phthalocyanine crystal having excellent properties as charge generating substance, and a manufacturing method thereof can be obtained.

Further features of the present invention will become apparent from the following description of exemplary embodiments with reference to the attached drawings.

DESCRIPTION OF THE EMBODIMENTS

Figure 1:
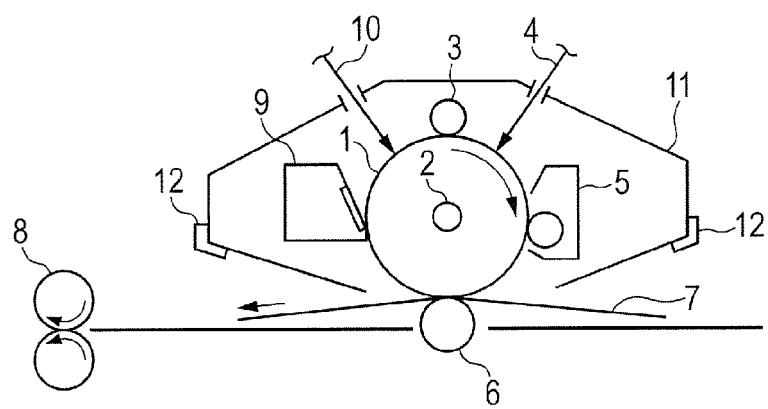
FIG. 1 is a schematic view of an electrophotographic apparatus provided with a process cartridge having an electrophotographic photosensitive member of the present invention.

Preferred embodiments of the present invention will now be described in detail in accordance with the accompanying drawings.

As described above, an electrophotographic photosensitive member includes a support and a photosensitive layer formed on the support. According to the present invention, the photosensitive layer contains a phthalocyanine crystal including N,N-dimethylformamide in the crystal, and the content of N,N-dimethylformamide is 0.1% by mass or more and 1.5% by mass or less relative to phthalocyanine in the phthalocyanine crystal.

As described below, examples of the phthalocyanine which constitutes the phthalocyanine crystal which contains N,N-dimethylformamide in the crystal include a metal-free phthalocyanine and a metal phthalocyanine which may have an axial ligand, and the phthalocyanine may have a substituent. An oxytitanium phthalocyanine crystal and a gallium phthalocyanine crystal are preferred in particular, with excellent sensitivity, while easily causing ghosting.

As described below, examples of the gallium phthalocyanine to constitute the gallium phthalocyanine crystal which contains N,N-dimethylformamide in the crystal include a gallium phthalocyanine molecule of which gallium atom has an axial ligand of a halogen atom, a hydroxy group or an alkoxy group. The phthalocyanine ring may include a substituent such as a halogen atom.

Among gallium phthalocyanine crystals, a hydroxygallium phthalocyanine crystal, a bromo-gallium phthalocyanine crystal and an iodo-gallium phthalocyanine crystal, having excellent sensitivity, are preferred, having sufficient effect of the present invention. A hydroxygallium phthalocyanine crystal is preferred in particular. The hydroxygallium phthalocyanine crystal includes a gallium atom having an axial ligand of hydroxy group. The bromo-gallium phthalocyanine crystal includes a gallium atom having an axial ligand of bromine atom. The iodo-gallium phthalocyanine crystal includes a gallium atom having an axial ligand of iodine atom.

A hydroxygallium phthalocyanine crystal having peaks at Bragg angles 2θ of 7.5°±0.2, 9.9°±0.2, 25.2°±0.2° and 28.3°±0.2° in CuKα characteristic X-ray diffraction, and the intensity of a peak emerging at 9.9°±0.2° being two or more times the intensity at a side 2.8° wider from the angle of the peak emerging at 9.9°±0.2° in particular is preferred. The hydroxygallium phthalocyanine crystal is more preferred in terms of the effect of reducing image defects due to ghosting.

In the present invention, the content of N,N-dimethylformamide is 0.1% by mass or more and 1.5% by mass or less relative to phthalocyanine in the phthalocyanine crystal. With a content of N,N-dimethylformamide more than 1.5% by mass, inhibition of ghosting under a normal temperature and normal humidity environment and under a low temperature and low humidity environment may not be sufficient in some cases. The content of N,N-dimethylformamide is more preferably 0.8% by mass or more and 1.3% by mass or less.

A manufacturing method of a phthalocyanine crystal which contains N,N-dimethylformamide in the crystal is described below.

The phthalocyanine crystal which contains N,N-dimethylformamide in the crystal is obtained by performing crystal transformation by adding phthalocyanine to N,N-dimethylformamide and milling the mixture. The phthalocyanine for use in the milling treatment can be a phthalocyanine obtained by acid pasting.

The milling treatment is a treatment in a milling device such as a sand mill and a ball mill, using dispersion material such as glass beads, steel beads and alumina balls.

The amount of dispersion material in milling treatment can be 10 to 50 times the amount of gallium phthalocyanine by mass. Examples of the transformation solvent other than N,N-dimethylformamide include an amide solvent such as N,N-dimethylacetoamide, N-methylformamide, N-methylacetoamide, N-methylpropionamide and N-methyl-2-pyrrolidone, a halogen solvent such as chloroform, an ether solvent such as tetrahydrofuran, and a sulfoxide solvent such as dimethyl sulfoxide which may be used in combination. The amount of solvent used can be 5 to 30 times the amount of phthalocyanine by mass.

The phthalocyanine crystal including 0.1% by mass or more and 1.5% by mass or less of N,N-dimethylformamide relative to phthalocyanine crystal is obtained by performing crystal transformation with a milling treatment for longer hours than in a conventional method. More specifically the length of time for the milling treatment is 250 hours or more.

A hydroxygallium phthalocyanine crystal having an intensity of the peak emerging at 9.9°±0.2° 2.0 or more times the intensity on a side 2.8° wider from the angle of the peak emerging at 9.9°±0.2° is more easily obtained by performing crystal transformation with a milling method having a low shear strength.

More specifically, a desired crystal can be obtained by performing the transformation with a ball mill for 250 hours or more. More preferably, the transformation is performed for 400 hours or more.

The present inventors newly found that the amount of N,N-dimethylformamide incorporated into the phthalocyanine crystal decreases as the length of time for crystal transformation is extended. As a result of examination by the present inventors, it was found that the phthalocyanine crystal which contains a specific amount of N,N-dimethylformamide in the crystal has excellent effect of inhibiting ghosting.

The phthalocyanine crystal which contains N,N-dimethylformamide in the crystal means allowing the N,N-dimethylformamide to be incorporated into the crystal.

In the present invention, the NMR measurement data of the obtained phthalocyanine crystal is analyzed to determine whether the phthalocyanine crystal contains N,N-dimethylformamide in the crystal, and to further determine the content of N,N-dimethylformamide.

The X-ray diffraction analysis and the NMR measurement of the phthalocyanine crystal of the present invention were performed under the following conditions.

[Powder X-Ray Diffraction Analysis]
Measurement instrument: X-ray diffraction analyzer RINT-TTRII made by Rigaku Corporation
X-ray tube: Cu
X-ray tube voltage: 50 KV
X-ray tube current: 300 mA
Scanning method: 2θ/θ scan
Scanning rate: 4.0°/min
Sampling interval: 0.02°

Starting angle (2θ): 5.0°
Stopping angle (2θ): 40.0°
Attachment: Standard sample holder
Filter: non-use
Incident monochrome: in-use
Counter monochrometer: non-use
Divergence slit: open
Vertical divergence limiting slit: 10.00 mm
Scattering slit: open
Light receiving slit: open
Flat plate monochrometer: in use
Counter: scintillation counter

[NMR Measurement]

Measurement instrument: Trade name: AVANCE III 500 made by Bruker
Solvent: deuterium sulfate ($D_2SO_4$)
Cumulative number: 2000

The phthalocyanine crystal which contains N,N-dimethylformamide in the crystal has an excellent function as a photoconductive material, and is applicable to a solar cell, a sensor, a switching device and the like, in addition to an electrophotographic photosensitive member.

Subsequently, the case of using the phthalocyanine crystal which contains N,N-dimethylformamide in the crystal as the charge generating substance in an electrophotographic photosensitive member is described in the following.

The electrophotographic photosensitive member of the present invention has a support and a photosensitive layer formed on the support. A photosensitive layer includes: a single-layer type photosensitive layer having a single layer which contains a charge generating substance and a charge transporting substance; and a laminate type photosensitive layer having a lamination structure of a charge generation layer which contains a charge generating substance and a charge transport layer which contains a charge transporting substance. Among them, a laminate type photosensitive layer having a charge generation layer, and a charge transport layer formed on the charge generation layer can be used.

A support having electrical conductivity (conductive support) is suitable. The support may be made of, for example, metal such as aluminum, aluminum alloy, copper, zinc, stainless steel, vanadium, molybdenum, chromium, titanium, nickel, indium, gold and platinum, and metal alloy. Alternatively, a support may be made of a plastic coated with a vacuum deposited layer of aluminum, aluminum alloy, indium oxide, tin oxide or indium oxide-tin oxide alloy. Alternatively, a support may be made of a plastic or the support coated with conductive particles and a binder resin; a plastic or paper support impregnated with conductive particles; a plastic including a conductive polymer or the like. Examples of the conductive particles include aluminum particles, titanium oxide particles, tin oxide particles, zinc oxide particles, carbon black, and silver particles.

In the present invention, an undercoat layer (also referred to as a barrier layer or an intermediate layer) having a barrier function and an adhesive function may be disposed between the support and the photosensitive layer. An undercoat layer can be formed by forming a coating film made from a coating liquid for forming an undercoat layer obtained by mixing a binder resin and a solvent, and drying the coating film.

The binder resin can be made from a raw material such as polyvinyl alcohol, polyethylene oxide, ethyl cellulose, methyl cellulose, casein, polyamide (e.g. nylon 6, nylon 66, nylon 610, a copolymer nylon, N-alkoxymethylated nylon) and polyurethane. The undercoat layer has a film thickness of 0.1 to 10 μm, preferably 0.5 to 5 μm.

In the case of forming a single-layer type photosensitive layer, the phthalocyanine crystal of the present invention is used as the charge generating substance, and along with the charge transporting substance is mixed into a binder resin solution so as to prepare a coating liquid for forming a photosensitive layer. The coating liquid for forming a photosensitive layer is applied onto a support so as to form a coating film, and drying the produced coating film to form a photosensitive layer.

In the case of forming a laminate-type photosensitive layer, the charge generation layer can be formed by dispersing phthalocyanine crystals of the present invention in a binder resin solution so as to prepare the coating liquid for forming a charge generation layer, applying the coating liquid to form a coating film, and drying the produced coating film. Alternatively the charge generation layer may be formed by vapor deposition.

The charge transport layer can be formed by dissolving a charge transporting substance and a binder resin in a solvent so as to prepare the coating liquid for forming a charge transport layer, and applying the coating liquid on the charge generation layer so as to form a coating film, and drying the produced coating film.

Examples of the charge transporting substance include a triarylamine-based compound, a hydrazine-based compound, a stilbene-based compound, a pyrazoline-based compound, an oxazole-based compound, a thiazole-based compound and a triallylmethane-based compound.

Examples of the binder resin for use in the single-layer type photosensitive layer, the charge generation layer and the charge transport layer include the following. For example, a resin such as polyester, an acrylic resin, polyvinylcarbazole, a phenoxy resin, polycarbonate, polyvinylbutyral, polystyrene, polyvinyl acetate, polysulfone, polyalylate, vinylidene chloride, acrylonitrile copolymer and polyvinyl benzal is used.

Examples of the application method to form a photosensitive layer include dip coating, spray coating, spinner coating, bead coating, blade coating and beam coating.

A single-layer type photosensitive layer can have a film thickness of 5 to 40 μm, more preferably 10 to 30 μm. The charge generation layer of a laminate type photosensitive layer can have a film thickness of 0.01 to 10 μm, more preferably 0.1 to 3 μm. The charge transport layer can have a film thickness of 5 to 40 μm, more preferably 10 to 30 μm.

The content of the charge generating substance in the charge generation layer of a laminate type photosensitive layer can be 20 to 90% by mass relative to the total mass of the charge generation layer, more preferably 50 to 80% by mass. The content of the charge transporting substance in the charge transport layer can be 20 to 80% by mass relative to the total mass of the charge transport layer, more preferably 30 to 70% by mass.

The content of the charge generating substance of a single-layer type photosensitive layer can be 3 to 30% by mass relative to the total mass of the photosensitive layer. The content of the charge transporting substance can be 30 to 70% by mass relative to the total mass of the photosensitive layer.

The phthalocyanine crystal of the present invention may be mixed with another charge generating substance for use as charge generating substance. In that case, the content of the phthalocyanine crystal of the present invention can be 50% by mass or more relative to the total charge generating substance.

A protective layer may be provided on the photosensitive layer on an as needed basis. The protective layer can be formed by dissolving a binder resin in a solvent so as to prepare the coating liquid for forming a protective layer, forming a coating film from the coating liquid, and drying the produced coating film. Examples of the binder resin for use in the protective layer include for example, polyvinylbutyral, polyester, polycarbonate (e.g., polycarbonate Z and modified polycarbonate), nylon, polyimide, polyallylate, polyurethane, a styrene-butadiene copolymer, a styrene-acrylic acid co-polymer and a styrene-acrylonitrile co-polymer.

The protective layer can have a film thickness of 0.05 to 20 µm.

The protective layer may contain conductive particles or an ultraviolet absorbing agent. Examples of the conductive particles include metal oxide particles such as tin oxide particles.

FIG. 1 is a schematic view of an electrophotographic apparatus provided with a process cartridge having an electrophotographic photosensitive member of the present invention.

An electrophotographic photosensitive member 1 having a cylindrical shape (drum shape), is rotation driven around an axis 2 at a predetermined circumferential speed (process speed) in an arrow direction.

The surface of the electrophotographic photosensitive member 1 is electrostatically charged to a positive or negative predetermined potential with a charging unit 3 during in a rotation process. Subsequently the charged surface of the electrophotographic photosensitive member 1 is irradiated with image exposing light 4 from an image exposing unit (not drawn in figure) so as to form an electrostatic latent image corresponding to objective image information. The image exposing light 4 are intensity-modulated in response to the time-series electric digital image signals of objective image information, outputted from, for example, an image exposing unit for slit exposing or exposing with scanning laser beams.

The electrostatic latent image formed on the surface of the electrophotographic photosensitive member 1 is developed (normal development or reversal development) with toner stored in a developing unit 5 so as to form a toner image on the surface of the electrophotographic photosensitive member 1. The toner image formed on the surface of the electrophotographic photosensitive member 1 is transferred to a transfer material 7 with a transferring unit 6. On this occasion, a bias voltage having a polarity reversal of the charge retained on the toner is applied to the transferring unit 6 from a bias power supply (not drawn in figure). A transfer material 7 of paper is taken out from a paper feeding part (not drawn in figure) so as to be fed between the electrophotographic photosensitive member 1 and the transferring unit 6 in synchronization with the rotation of the electrophotographic photosensitive member 1.

The transfer material 7 having a toner image transferred from the electrophotographic photosensitive member 1 is separated from the surface of the electrophotographic photosensitive member 1 and transported to an image fixation unit 8 for the fixation of the toner image. An image formed object (print or copy) is thus printed out from an electrophotographic apparatus.

After transfer of the toner image to the transfer material 7, the surface of the electrophotographic photosensitive member 1 is cleaned with a cleaning unit 9 to remove attached material such as toner (remaining toner after transfer). In a recently developed cleaner-less system, toner may be directly removed after transfer with a development apparatus or the like. Subsequently the surface of the electrophotographic photosensitive member 1 is neutralized with pre-exposing light 10 from a pre-exposing unit (not drawn in figure) and then repeatedly used for image formation. The pre-exposing unit is not necessarily required for a contact charging unit 3 having a charging roller.

In the present invention, a plurality of components selected from the group consisting of the electrophotographic photosensitive member 1, the charging unit 3, the developing unit 5, and the cleaning unit 9 may be contained in a container and integrally supported to form a process cartridge. The process cartridge can be configured to be detachable to an electrophotographic apparatus body. For example, a charging unit 3, a developing unit 5 and a cleaning unit 9 are integrally supported together with the electrophotographic photosensitive member 1 so as to form a cartridge. The cartridge constitutes a process cartridge 11 detachable to an electrophotographic apparatus body with a guiding unit 12 such as a rail of the electrophotographic apparatus body.

Image exposing light 4 may be reflected beams from or transmitted beams through a sheet of manuscript for an electrophotographic apparatus such as a copy machine and a printer. Alternatively, image exposing light 4 may be radiated beams produced by scanning of laser beams, driving of an LED array or driving of a liquid crystal shutter array in response to signals from a manuscript reading sensor.

The electrophotographic photosensitive member 1 of the present invention can be widely used in an electrophotography application field such as a laser beam printer, a CRT printer, an LED printer, a FAX, a liquid crystal printer and a laser engraving.

EXAMPLES

The present invention is described further in detail in reference to specific Examples in the following, although the present invention is not limited thereto. In the following description, "parts" means "parts by mass". The film thickness of each of the layers of electrophotographic photosensitive members in Examples and Comparative Examples was obtained with an eddy-current film thickness meter (Fischerscope made by Fischer Instruments K.K.), or based on the specific gravity converted from a mass per unit area.

Example 1-1

As described below, hydroxygallium phthalocyanine was produced by the same as in Synthesis Example 1 and Example 1-1 described in Japanese Patent Application Laid-Open No. 2011-94101. Under nitrogen flow atmosphere, 5.46 parts of phthalonitrile and 45 parts of α-chloronaphthalene were fed into a reaction tank, then heated up to a temperature of 30° C., and maintained at the temperature. Subsequently, 3.75 parts of gallium trichloride was fed thereto at the temperature (30° C.). At the feeding time, the mixture liquid had a water content of 150 ppm. The temperature was then increased to 200° C. Under the nitrogen flow atmosphere, a reaction was caused at a temperature of 200° C. for 4.5 hours, which was then cooled to a temperature of 150° C. for filtering a product. The produced residue was dispersed and cleaned with N,N-dimethylformamide at a temperature of 140° C. for 2 hours, and then filtrated. The produced residue was cleaned with methanol and dried to produce 4.65 parts of chlorogallium phthalocyanine pigment (yield: 71%). Subsequently, 4.65 parts of the produced chlorogallium phthalocyanine pigment was dissolved in 139.5 parts of concentrated sulfuric acid at a temperature of 10° C., and instilled into 620 parts of iced water under agitation for reprecipitation. The product was filtrated with a filter press. Subsequently, the produced wet cake (residue) was dispersed and cleaned with 2% ammonia water, and filtrated with a filter press. Subsequently, the produced wet cake (residue) was dispersed and cleaned with ion-exchange water, and then filtration with a filter press was repeated 3 times. Then, hydroxygallium phthalocyanine (hydrous hydroxygallium phthalocyanine) having a solid content of 23% was produced. The produced hydroxygallium phthalocyanine (hydrous hydroxygallium phthalocyanine) in an amount of 6.6 kg was irradiated by microwave with a hyper dryer (trade name: HD-06R, frequency (oscillation frequency): 2,455 MHz±15 MHz, made by Biocon Japan Ltd.) so as to be dried.

Figure 2:
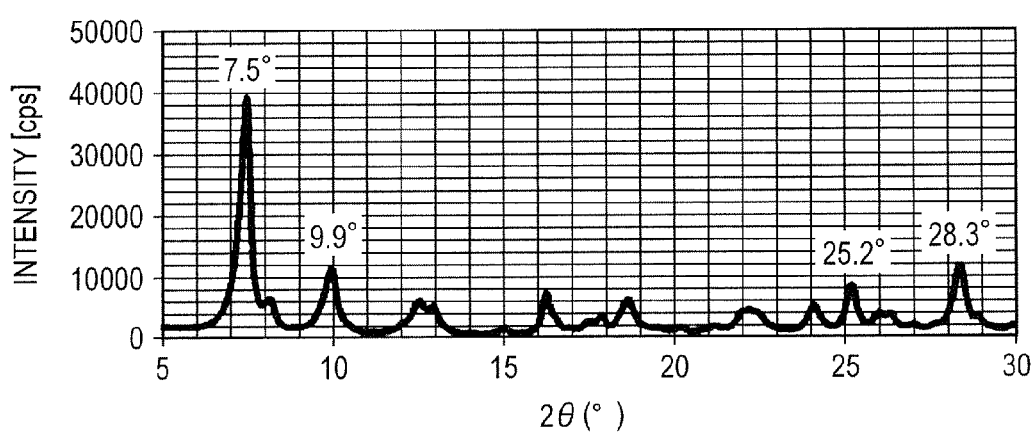
FIG. 2 is a powder X-ray diffraction chart of a hydroxygallium phthalocyanine crystal obtained in Example 1-1.

Thus produced 0.5 parts of hydroxygallium phthalocyanine, and 9.5 parts of N,N-dimethylformamide were put in a ball mill with 15 parts of glass beads having a diameter of 0.8 mm so as to be milled at room temperature (23° C.) for 1000 hours. A gallium phthalocyanine crystal was produced from the dispersion liquid using N,N-dimethylformamide. In filtration, the strainer was sufficiently cleaned with tetrahydrofuran. The filter residue was vacuum dried so that 0.43 parts of hydroxygallium phthalocyanine crystal was obtained. The powder X-ray diffraction chart of the produced crystal is illustrated in FIG. 2, and the angle and the intensity of the peak emerging at Bragg angle 2θ of 9.9°±0.2°, the intensity on a side 2.8° wider from the peak angle, and the ratio of the intensity are described in Table 1.

The crystal was dissolved in deuterium sulfate for the H-NMR measurement. As a result, a peak derived from N,N-dimethylformamide was observed other than the peak derived from a phthalocyanine molecule. Since N,N-dimethylformamide is a liquid having compatibility with tetrahydrofuran, it was found that N,N-dimethylformamide is contained in the phthalocyanine crystal. The content of N,N-dimethylformamide in the phthalocyanine crystal was 1.03% by mass relative to phthalocyanine in the phthalocyanine crystal, in terms of the proton ratio.

Example 1-2

A hydroxygallium phthalocyanine crystal in an amount of 0.42 parts was obtained by the same treatment as in Example 1-1, except that the milling treatment time was changed from 1000 hours to 2000 hours in Example 1-1. The powder X-ray diffraction pattern of the produced crystal was the same as in Example 1-1. The angle and the intensity of the peak emerging at Bragg angle 2θ of 9.9°±0.2°, the intensity on a side 2.8° wider from the peak angle, and the ratio of the intensity are described in Table 1.

It was confirmed that 0.80% by mass N,N-dimethylformamide is contained relative to phthalocyanine in the phthalocyanine crystal by the NMR measurement.

Example 1-3

A hydroxygallium phthalocyanine crystal in an amount of 0.44 parts was obtained by the same treatment as in Example 1-1, except that the milling treatment time was changed from 1000 hours to 500 hours in Example 1-1. The powder X-ray diffraction pattern of the produced crystal was the same as in Example 1-1. The angle and the intensity of the peak emerging at Bragg angle 2θ of 9.9°±0.2°, the intensity on a side 2.8° wider from the peak angle, and the ratio of the intensity are described in Table 1.

It was confirmed that 1.23% by mass N,N-dimethylformamide is contained relative to phthalocyanine in the phthalocyanine crystal by the NMR measurement.

Example 1-4

A hydroxygallium phthalocyanine crystal in an amount of 0.44 parts was obtained by the same treatment as in Example 1-1, except that the milling treatment time was changed from 1000 hours to 400 hours in Example 1-1. The powder X-ray diffraction pattern of the produced crystal was the same as in Example 1-1. The angle and the intensity of the peak emerging at Bragg angle 2θ of 9.9°±0.2°, the intensity on a side 2.8° wider from the peak angle, and the ratio of the intensity are described in Table 1.

It was confirmed that 1.31% by mass N,N-dimethylformamide is contained relative to the phthalocyanine in the phthalocyanine crystal by the NMR measurement.

Example 1-5

Figure 3:
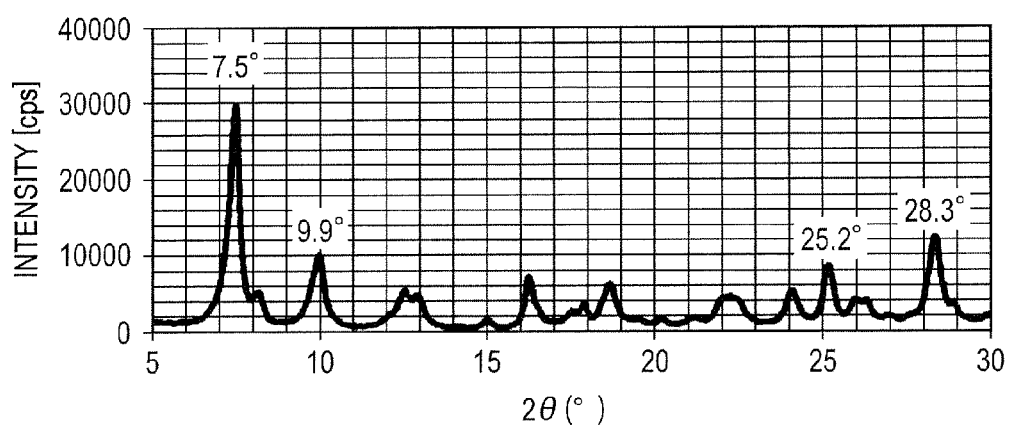
FIG. 3 is a powder X-ray diffraction chart of a hydroxygallium phthalocyanine crystal obtained in Example 1-5.

A hydroxygallium phthalocyanine crystal in an amount of 0.44 parts was obtained by the same treatment as in Example 1-1, except that the milling treatment time was changed from 1000 hours to 300 hours in Example 1-1. The powder X-ray diffraction chart of the produced crystal is illustrated in FIG. 3. The angle and the intensity of the peak emerging at Bragg angle 2θ of 9.9°±0.2°, the intensity on a side 2.8° wider from the peak angle, and the ratio of the intensity are described in Table 1.

It was confirmed that 1.42% by mass N,N-dimethylformamide is contained relative to the phthalocyanine in the phthalocyanine crystal by the NMR measurement.

Example 1-6

A hydroxygallium phthalocyanine crystal in an amount of 0.44 parts was obtained by the same treatment as in Example 1-1, except that the milling treatment time was changed from 1000 hours to 250 hours in Example 1-1. The powder X-ray diffraction pattern of the produced crystal was the same as in Example 1-5. The angle and the intensity of the peak emerging at Bragg angle 2θ of 9.9°±0.2°, the intensity on a side 2.8° wider from the peak angle, and the ratio of the intensity are described in Table 1.

It was confirmed that 1.50% by mass N,N-dimethylformamide is contained relative to the phthalocyanine in the phthalocyanine crystal by the NMR measurement.

Example 1-7

A hydroxygallium phthalocyanine crystal in an amount of 0.22 parts was obtained by the same treatment as in Example 1-3, except that the addition amount of hydroxygallium phthalocyanine for use in the milling treatment was changed from 0.5 parts to 0.25 parts in Example 1-3. The powder X-ray diffraction pattern of the produced crystal was the same as in Example 1-1. The angle and the intensity of the peak emerging at Bragg angle 2θ of 9.9°±0.2°, the intensity on a side 2.8° wider from the peak angle, and the ratio of the intensity are described in Table 1.

It was confirmed that 1.34% by mass N,N-dimethylformamide is contained relative to the phthalocyanine in the phthalocyanine crystal by the NMR measurement.

Example 1-8

A hydroxygallium phthalocyanine crystal in an amount of 0.22 parts was obtained by the same treatment as in Example 1-5, except that the addition amount of N,N-dimethylformamide for use in milling treatment was changed from 9.5 parts to 3 parts and added 6.5 parts of N-methylpyrrolidone in Example 1-5. The powder X-ray diffraction pattern of the produced crystal was the same as in Example 1-5. The angle and the intensity of the peak emerging at Bragg angle 2θ of 9.9°±0.2°, the intensity on a side 2.8° wider from the peak angle, and the ratio of the intensity are described in Table 1.

It was confirmed that 0.50% by mass N,N-dimethylformamide is contained relative to the phthalocyanine in the phthalocyanine crystal by the NMR measurement.

Example 1-9

Figure 4:
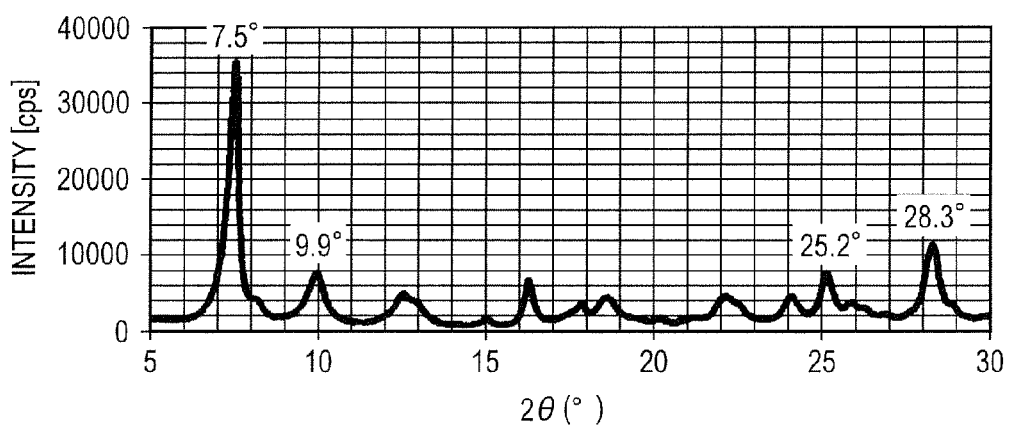
FIG. 4 is a powder X-ray diffraction chart of a hydroxygallium phthalocyanine crystal obtained in Example 1-9.

A hydroxygallium phthalocyanine crystal in an amount of 0.45 parts was obtained by the same treatment as in Example 1-1, except that the milling device was replaced from a ball mill to a paint shaker and the treatment time was changed to 24 hours in Example 1-1. The powder X-ray diffraction pattern of the produced crystal was broader than the pattern obtained in Example 1-1. The powder X-ray diffraction chart of the produced crystal is illustrated in FIG. 4. The angle and the intensity of the peak emerging at Bragg angle 2θ of 9.9°±0.2°, the intensity on a side 2.8° wider from the peak angle, and the ratio of the intensity are described in Table 1.

It was confirmed that 1.45% by mass N,N-dimethylformamide is contained relative to the phthalocyanine in the phthalocyanine crystal by the NMR measurement.

TABLE 1

|  | Peak at 9.9° ± 0.2° | | Intensity on a side | |
| --- | --- | --- | --- | --- |
|  | Emerging position(°) | Intensity | 2.80° wider from the peak | Intensity ratio |
| Example 1-1 | 9.96 | 11215 | 4683 | 2.39 |
| Example 1-2 | 9.96 | 10823 | 5298 | 2.04 |
| Example 1-3 | 9.96 | 11055 | 4505 | 2.45 |
| Example 1-4 | 9.96 | 10976 | 4428 | 2.48 |
| Example 1-5 | 9.96 | 11090 | 4401 | 2.52 |
| Example 1-6 | 9.94 | 11443 | 4509 | 2.54 |
| Example 1-7 | 9.96 | 11147 | 4544 | 2.45 |
| Example 1-8 | 9.94 | 10989 | 4607 | 2.39 |
| Example 1-9 | 9.92 | 7823 | 4338 | 1.80 |

Comparative Example 1-1

A hydroxygallium phthalocyanine crystal in an amount of 0.44 parts was obtained by the same treatment as in Example 1-1, except that the milling treatment time was changed from 1000 hours to 48 hours in Example 1-1.

It was confirmed that 2.12% by mass N,N-dimethylformamide is contained relative to the phthalocyanine in the phthalocyanine crystal by the NMR measurement of the obtained crystal.

Comparative Example 1-2

A hydroxygallium phthalocyanine crystal in an amount of 0.44 parts was obtained by the same treatment as in Example 1-1, except that the milling treatment time was changed from 1000 hours to 24 hours in Example 1-1.

It was confirmed that 2.50% by mass N,N-dimethylformamide is contained relative to the phthalocyanine in the phthalocyanine crystal by the NMR measurement of the obtained crystal.

Comparative Example 1-3

A hydroxygallium phthalocyanine crystal in an amount of 0.44 parts was obtained by the same treatment as in Example 1-1, except that the milling device was replaced from a ball mill to a paint shaker and the treatment time was changed to 4 hours in Example 1-1.

It was confirmed that 2.70% by mass N,N-dimethylformamide is contained relative to the phthalocyanine in the phthalocyanine crystal by the NMR measurement of the obtained crystal.

Example 2-1

Firstly, a mixed solution of 50 parts of 2-methoxy-1-propanol, and 50 parts of methanol, including 60 parts of barium sulfate particles coated with tin oxide (trade name: Passtran PC1, made by Mitsui Mining & Smelting Co., Ltd.),
15 parts of titanium oxide particles (trade name: TITANIX JR, made by Tayca Corporation),
43 parts of a resol-type phenol resin (trade name: Phenolite J-325 made by DIC Corporation, solid content: 70% by mass), 0.015 parts of silicone oil (trade name: SH28PA, made by Dow Corning Toray Co., Ltd.),
3.6 parts of silicone resin (trade name: Tospearl 120, made by Momentive Performance Materials Inc.),
was put in a ball mill, and dispersed for 20 hours so as to prepare a coating liquid for forming a conductive layer.

The coating liquid for forming a conductive layer was applied on aluminum cylinder (diameter: 24 mm) as a support with immersion coating so as to form a coating film, and the produced coating film was dried at 140° C. for 30 minutes so that a conductive layer having a film thickness of 15 μm was formed.

Subsequently 10 parts of copolymer nylon resin (trade name: Amilan CM8000, made by Toray Industries, Inc.) and 30 parts of methoxymethylated 6-nylon resin (trade name: Tresin EF-30T, made by Nagase Chemtex Corporation) were dissolved in a mixed solvent of 400 parts of methanol and 200 parts of n-butanol so as to prepare a coating liquid for forming an undercoat layer.

The coating liquid for forming an undercoat layer was applied to the conductive layer with immersion coating, and the produced coating film was dried so that an undercoat layer having a film thickness of 0.5 μm was formed.

Subsequently, 10 parts of the hydroxygallium phthalocyanine crystal (charge generating substance) produced in Example 1-1,
5 parts of polyvinylbutyral (trade name: S-LEC BX-1, made by Sekisui Chemical Co., Ltd.), and 250 parts of cyclohexanone
were put in a sand mill with glass beads having a diameter of 1 mm for dispersion treatment for 4 hours. To the dispersion liquid, 250 parts of ethyl acetate was added to dilute it, thereby preparing a for forming a charge generation layer.

The coating liquid for forming a charge generation layer was applied to the undercoat layer with immersion coating so as to form a coating film. The produced coating film was dried at 100° C. for 10 minutes to form the charge generation layer having a film thickness of 0.16 μm.

Subsequently, 8 parts of a compound (charge transporting substance) represented by the following formula (1) and 10 parts of polycarbonate (trade name: Iupilon Z-200, made by Mitsubishi Engineering-Plastics Corporation) were dissolved in 70 parts of monochlorobenzene so as to prepare a coating liquid for forming a charge transport layer.

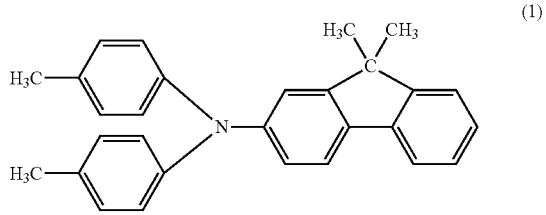 [SMILES: Cc1ccc(N(c2ccc(C)cc2)c2ccc3c(c2)C(C)(C)c2ccccc2-3)cc1]

(1)

The coating liquid for forming a charge transport layer was applied to the charge generation layer by immersion coating so as to form a coating film. The produced coating film was dried at 110° C. for 1 hour to form a charge transport layer having a film thickness of 23 μm.

The electrophotographic photosensitive member of Example 2-1 in a cylindrical shape (drum shape) was thus manufactured.

Examples 2-2 to 2-9

Except that the hydroxygallium phthalocyanine crystal in preparing the coating liquid for forming a charge generation layer in Example 2-1 was replaced with the hydroxygallium phthalocyanine crystals produced in Examples 1-2 to 1-9, the electrophotographic photosensitive members in Examples 2-2 to 2-9 were made in the same way as in Example 2-1.

Comparative Examples 2-1 to 2-3

Except that the hydroxygallium phthalocyanine crystal in preparing the coating liquid for forming a charge generation layer in Example 2-1 was replaced with the hydroxygallium phthalocyanine crystals produced in Comparative Examples 1-1 to 1-3, the electrophotographic photosensitive members in Comparative Examples 2-1 to 2-3 were made in the same way as in Example 2-1.

Evaluation of Examples 2-1 to 2-9 and Comparative Examples 2-1 to 2-3

The electrophotographic photosensitive members of Examples 2-1 to 2-9 and Comparative Examples 2-1 to 2-3 were evaluated for ghost images.

A laser beam printer made by Hewlett Packard Japan, Ltd (trade name: Color Laser Jet CP3525dn) was modified to use as an electrophotographic apparatus for evaluation. As a result of modification, a pre-exposing light was unlit and charging conditions and the amount of image exposure were variably controlled. In addition, a manufactured electrophotographic photosensitive member was mounted in a process cartridge for cyan color and attached to the station of the process cartridge for cyan, allowing for operation without mounting of process cartridges for other colors to the laser beam printer main body.

In outputting an image, the process cartridge for cyan color alone was attached to the main body so that a single color image was outputted using cyan toner alone.

The charging conditions and the amount of image exposure were adjusted such that the initial potential was set at −500V for a dark part and −100V for a bright part under a normal temperature and normal humidity environment of temperature 23° C./humidity 55% RH. In the measurement of the surface potential of a drum-shaped electrophotographic photosensitive member for potential setting, the cartridge was firstly modified and a potential probe (trade name: model 6000B-8, made by Trek Japan Co., Ltd.) was mounted at the development position. The potential at the center of an electrophotographic photosensitive member in a cylindrical shape was measured with a surface potential meter (trade name: model 344, made by Trek Japan Co., Ltd).

After potential setting, the evaluation of ghost images (initial stage) was performed under the same conditions. Subsequently, a repeated paper feed test was performed with 1,000 sheets of paper fed through, and ghost images were evaluated immediately after and 15 hours after the repeated paper feed test. Evaluation results under a normal temperature and normal humidity environment are described in Table 2.

Subsequently, the electrophotographic photosensitive member was left to stand under a low temperature and low humidity environment of temperature 15° C./humidity 10% RH together with the electrophotographic apparatus for evaluation for 3 days so as to evaluate ghost images (initial stage). A repeated paper feed test was performed with 1,000 sheets of paper fed through under the same conditions, and ghost images were evaluated immediately after and 15 hours after the repeated paper feed test. Evaluation results under the low temperature and low humidity environment are also described in Table 2.

In the repeated paper feed test with paper fed through, an image of character E of a coverage rate of 1% was formed on a plain paper of A4 size with cyan single color.

Ghost images were evaluated as follows.

In the evaluation of ghost images, a solid white image was outputted on a first sheet, and 4 types of ghost charts were outputted on respective 4 sheets in total. Then, a solid black image was outputted on a sheet, and the 4 types of ghost charts were outputted on respective 4 sheets in total once again. The images were outputted in this order, and the evaluation was performed based on the ghost images of 8 sheets in total. The ghost chart includes 4 solid black square images of 25 mm side arranged in parallel at equal intervals in the 30 mm-width region from the starting position of output images (10 mm from the top edge of paper) as a solid white background. In the region below the 30 mm-width region from the starting position of output images, 4 types of halftone printing patterns were printed. Ranks were classified based on 4 types of ghost charts.

The 4 types of ghost charts are charts arranged in the region below the 30-mm width region from the starting position of output images, with only difference in halftone pattern. The halftone patterns include the following 4 types:
(1) a printing pattern (laser exposing) with 1 dot and 1 space in lateral* direction;
(2) a printing pattern (laser exposing) with 2 dots and 2 spaces in lateral* direction;
(3) a printing pattern (laser exposing) with 2 dots and 3 spaces in lateral* direction; and
(4) a knight jump printing pattern (laser exposing) (a pattern with 2 dots printed in 6 squares in the knight jump direction).

*: The term "lateral" means the scanning direction of a laser beam directed at the surface of the electrophotographic photosensitive member from a laser scanner (the direction orthogonal to the outputting direction of the sheet outputted from the laser beam printer).

The ghost images were classified into ranks as follows. It was determined that the effect of the present invention was insufficient in the ranks 4, 5 and 6.
Rank 1: No ghosting was visible in any of the ghost charts.
Rank 2: Ghosting was vaguely visible in a specific ghost chart.
Rank 3: Ghosting was vaguely visible in any of the ghost charts.
Rank 4: Ghosting was visible in a specific ghost chart.
Rank 5: Ghosting was visible in any of the ghost charts.
Rank 6: Ghosting was sharply visible in a specific ghost chart.

TABLE 2

|  | Under normal temperature and normal humidity environment | | | Under low temperature and low humidity environment | | |
| --- | --- | --- | --- | --- | --- | --- |
|  | Initial stage | Immediately after durability test | 15 hours after durability test | Initial stage | Immediately after durability test | 15 hours after durability test |
| Example 2-1 | 1 | 2 | 2 | 2 | 2 | 3 |
| Example 2-2 | 1 | 2 | 2 | 2 | 3 | 3 |
| Example 2-3 | 2 | 2 | 3 | 2 | 3 | 3 |
| Example 2-4 | 2 | 2 | 3 | 2 | 3 | 3 |
| Example 2-5 | 2 | 3 | 3 | 2 | 3 | 3 |
| Example 2-6 | 2 | 3 | 3 | 2 | 3 | 3 |
| Example 2-7 | 2 | 2 | 3 | 2 | 3 | 3 |
| Example 2-8 | 2 | 3 | 3 | 2 | 3 | 3 |
| Example 2-9 | 2 | 3 | 3 | 3 | 3 | 3 |
| Comparative Example 2-1 | 4 | 5 | 4 | 5 | 6 | 5 |
| Comparative Example 2-2 | 4 | 5 | 5 | 5 | 6 | 6 |
| Comparative Example 2-3 | 5 | 6 | 6 | 6 | 6 | 6 |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-114918, filed Jun. 3, 2014, which is hereby incorporated by reference herein in its entirety.

What is claimed is:

1. A process of producing a phthalocyanine crystal containing N,N-dimethylformamide, comprising:

performing a crystal transformation by milling for at least 1000 hours a mixture of phthalocyanine and the N,N-dimethylformamide, and obtaining the phthalocyanine crystal containing N,N-dimethylformamide, wherein a content of N,N-dimethylformamide in said phthalocyanine crystal is 0.1 to 1.5% by mass based on phthalocyanine in the phthalocyanine crystal.

2. The process according to claim 1, wherein the phthalocyanine in the mixture prior to the step of crystal transformation is obtained by an acid pasting method.

* * * * *